(12) United States Patent
Kim et al.

(10) Patent No.: US 9,275,995 B2
(45) Date of Patent: Mar. 1, 2016

(54) SEMICONDUCTOR DEVICES HAVING COMPOSITE SPACERS CONTAINING DIFFERENT DIELECTRIC MATERIALS

(71) Applicant: Samsung Electronics Co., Ltd., Suwon-si (KR)

(72) Inventors: Jin-Bum Kim, Seoul (KR); Bon-Young Koo, Suwon-si (KR); Seok-Hoon Kim, Suwon-si (KR); Chul Kim, Seongnam-si (KR); Kwan-Heum Lee, Suwon-si (KR); Byeong-Chan Lee, Yongin-si (KR); Su-Jin Jung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/543,140

(22) Filed: Nov. 17, 2014

(65) Prior Publication Data

US 2015/0162332 A1 Jun. 11, 2015

(30) Foreign Application Priority Data

Dec. 5, 2013 (KR) ........................ 10-2013-0150856

(51) Int. Cl.

| | |
|---|---|
| *H01L 27/088* | (2006.01) |
| *H01L 29/161* | (2006.01) |
| *H01L 29/06* | (2006.01) |
| *H01L 29/66* | (2006.01) |
| *H01L 29/78* | (2006.01) |

(52) U.S. Cl.
CPC ........ *H01L 27/0886* (2013.01); *H01L 29/0653* (2013.01); *H01L 29/161* (2013.01); *H01L 29/66545* (2013.01); *H01L 29/785* (2013.01)

(58) Field of Classification Search
CPC .............. H01L 27/0886; H01L 29/161; H01L 29/0653; H01L 29/66545; H01L 29/785
See application file for complete search history.

(56) References Cited

U.S. PATENT DOCUMENTS

| | | | |
|---|---|---|---|
| 7,939,889 B2 | 5/2011 | Yu et al. | |
| 8,362,572 B2 | 1/2013 | Huang et al. | |
| 2009/0166625 A1 | 7/2009 | Ting et al. | |
| 2011/0068407 A1 | 3/2011 | Yeh et al. | |
| 2012/0184079 A1* | 7/2012 | Kim et al. | ...................... 438/300 |
| 2013/0295738 A1* | 11/2013 | Kuo et al. | ...................... 438/283 |

* cited by examiner

*Primary Examiner* — Long Pham
(74) *Attorney, Agent, or Firm* — Myers Bigel & Sibley, P.A.

(57) ABSTRACT

An integrated circuit device includes an electrically conductive pattern on a substrate. This electrically conductive pattern may be a gate pattern of a field effect transistor. A first electrically insulating spacer is provided on a sidewall of the electrically conductive pattern. The first electrically insulating spacer includes a first lower spacer and a first upper spacer, which extends on the first lower spacer and has a side surface vertically aligned with a corresponding side surface of the first lower spacer. The first upper spacer has a greater dielectric constant relative to a dielectric constant of the first lower spacer. A pair of parallel channel regions may also be provided, which protrude from a surface of the substrate. The electrically conductive pattern may surround top and side surfaces of the pair of parallel channel regions.

15 Claims, 21 Drawing Sheets

US 9,275,995 B2

SEMICONDUCTOR DEVICES HAVING COMPOSITE SPACERS CONTAINING DIFFERENT DIELECTRIC MATERIALS

REFERENCE TO PRIORITY APPLICATION

This application claims priority under 35 U.S.C. §119 to Korean Patent Application No. 10-2013-0150856, filed Dec. 5, 2013, the disclosure of which is hereby incorporated herein by reference in its entirety.

BACKGROUND

1. Field

Embodiments of the inventive concept provide a semiconductor device having epitaxially grown active regions and spacers.

2. Description of Related Art

A semiconductor device includes active regions. The active regions of the semiconductor device may be formed by selective epitaxially grown process. Various studies for improving carrier mobility, operating speed and power consumption of the semiconductor device are being progressed.

SUMMARY

Embodiments of the inventive concept provide a semiconductor device having epitaxially grown active regions. Embodiments of the inventive concept also provide a semiconductor device having a protruding fin field effect transistor (FinFET). Embodiments of the inventive concept also provide a semiconductor device having an upper spacer and a lower spacer with vertically aligned sidewalls.

Embodiments of the inventive concept also provide a semiconductor device having a spacer with a low dielectric constant between a gate electrode and an active region. Embodiments of the inventive concept also provide a semiconductor device having a molding formed around a channel region. Embodiments of the inventive concept also provide a method of fabricating the above-described semiconductor devices.

The technical objectives of the inventive disclosure are not limited to the above disclosure; other objectives may become apparent to those of ordinary skill in the art based on the following descriptions.

In accordance with an aspect of the inventive concept, a semiconductor device includes a gate pattern formed on a substrate, and a first spacer formed on a side surface of the gate pattern. The first spacer includes a first upper spacer and a first lower spacer having vertically aligned side surfaces, and the first upper spacer has a higher dielectric constant than the first lower spacer.

In accordance with another aspect of the inventive concept, a semiconductor device includes channel regions disposed on a substrate and configured to horizontally extend parallel to one another in a first direction, gate patterns configured to horizontally extend parallel to one another in a second direction orthogonal to the first direction and intersect the channel regions, each of the channel regions including a first channel region overlapping the corresponding one of the gate patterns and a second channel region non-overlapping the corresponding one of the gate patterns, and active regions disposed on the second channel regions and including silicon germanium (SiGe).

According to still further embodiments of the invention, an integrated circuit device (e.g., field effect transistor, FINFET) is provided, which includes an electrically conductive pattern on a substrate. The electrically conductive pattern may be a gate pattern. A first electrically insulating spacer is provided on a sidewall of the electrically conductive pattern. The first electrically insulating spacer includes a first lower spacer and a first upper spacer, which extends on the first lower spacer and has a side surface vertically aligned with a corresponding side surface of the first lower spacer. The first upper spacer has a greater dielectric constant relative to a dielectric constant of the first lower spacer.

A pair of parallel channel regions (e.g., vertically stacked channel regions) are also provided, which protrude from a surface of the substrate (e.g., a fin-shaped channel region). In addition, the electrically conductive pattern may be a gate pattern that surrounds top and side surfaces of the pair of parallel channel regions.

In some of these embodiments of the invention, the pair of parallel channel regions are vertically aligned to each other so that a first one of the pair of channel regions is above a second one of the pair of channel regions relative to the surface of the substrate. An active region is also provided in the substrate. The active region, which may be a SiGe active region, forms a junction with the second one of the pair of channel regions. An outer side surface of the first lower spacer is vertically aligned with the junction between the active region and the second one of the pair of channel regions.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 10A through 18A are longitudinal sectional views taken along the direction I-I' of FIG. 1 or a direction IV-IV' of FIG. 9, which illustrate the method of fabricating the semiconductor device as illustrated in FIGS. 3 through 9;

FIGS. 10B through 18B are longitudinal sectional views taken along the direction II-II' of FIG. 1 or a direction V-V' of FIG. 9, which illustrate the method of fabricating the semiconductor device as illustrated in FIGS. 3 through 9;

DETAILED DESCRIPTION OF THE EMBODIMENTS

Figure 1:
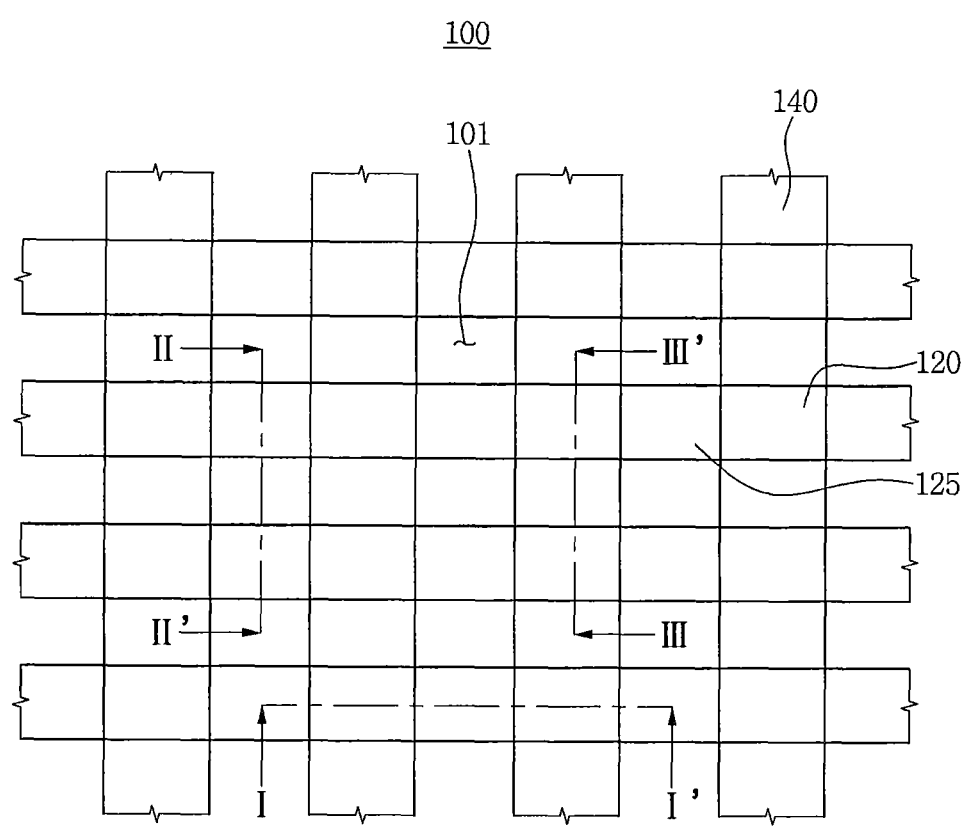
FIG. 1 is a layout of a semiconductor device according to embodiments of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art.

The terminology used herein is for the purpose of describing particular embodiments only and is not intended to be limiting of the inventive concept. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Embodiments of the inventive concept are described herein with reference to cross-section and/or plan illustrations that are schematic illustrations of idealized embodiments of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the inventive concept.

Like numbers refer to like elements throughout. Thus, the same or similar numbers may be described with reference to other drawings even if they are neither mentioned nor described in the corresponding drawing. Also, even elements that are not denoted by reference numbers may be described with reference to other drawings.

FIG. 1 is a layout of a semiconductor device 100 according to embodiments of the inventive concept. Referring to FIG. 1, the semiconductor device 100 according to the embodiments of the inventive concept may include channel regions 120 and/or active regions 125 disposed on a substrate 101 and having parallel line or bar shapes and gate patterns 140 configured to intersect the channel regions 120 or the active regions 125 at right angles and having parallel line or bar shapes. Each of the channel regions 120 may overlap the corresponding gate pattern 140. Each of the active regions 125 may not overlap the corresponding one of the gate patterns 140. For example, each of the active regions 125 may be formed between adjacent channel regions 120 or between adjacent gate patterns 140.

Figure 2A:
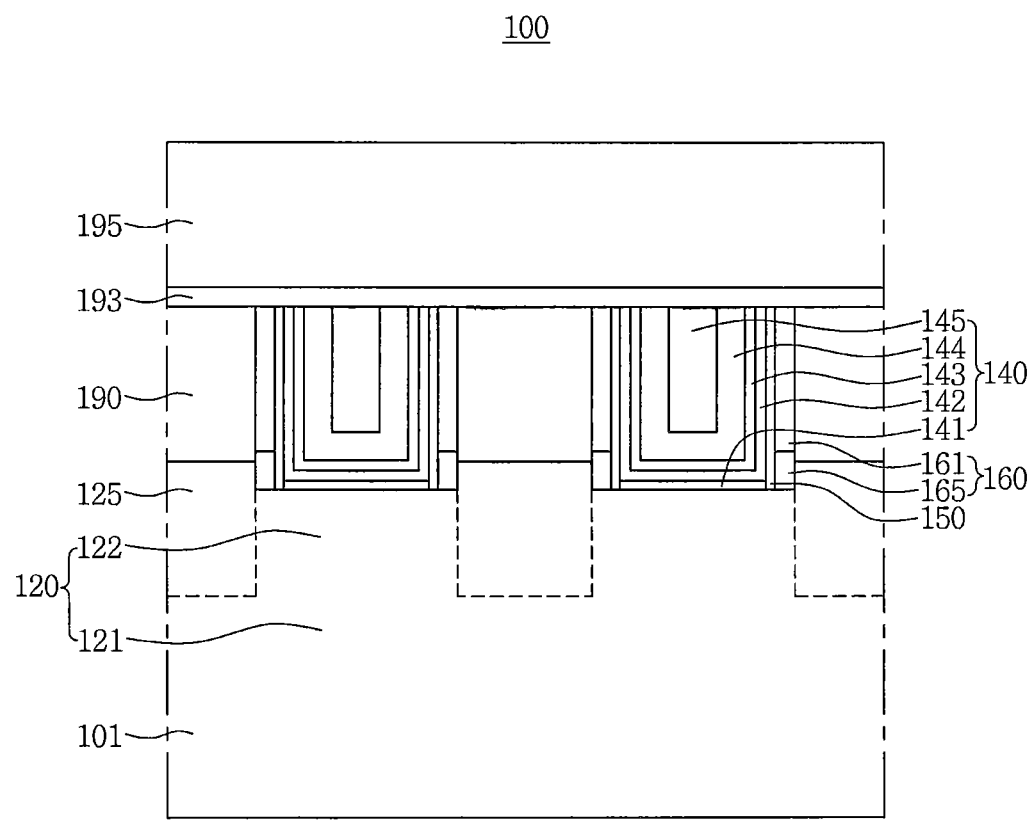
FIG. 2A is a longitudinal sectional view taken along a direction I-I' of FIG. 1.
Figure 2B:
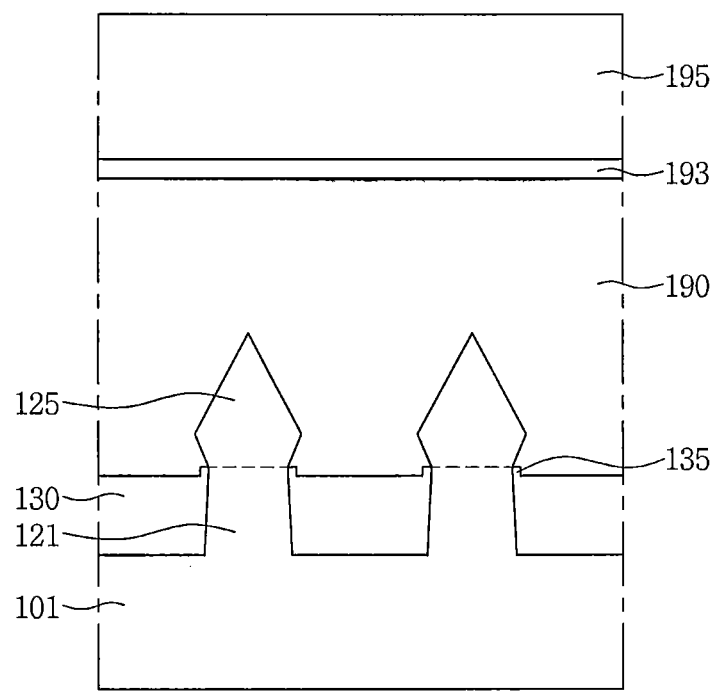
FIG. 2B is a longitudinal sectional view taken along a direction II-II' of FIG. 1.
Figure 2C:
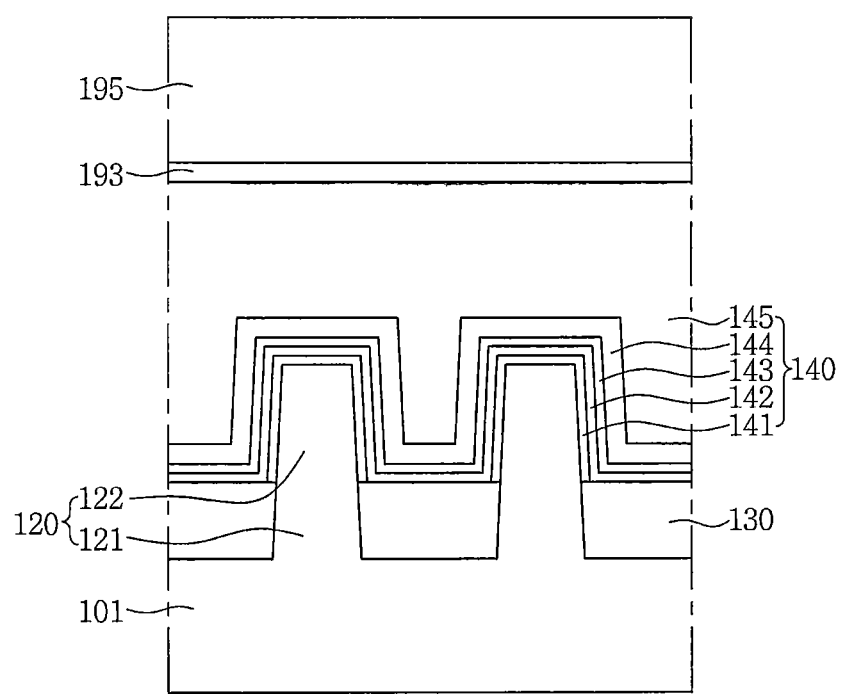
FIG. 2C is a longitudinal sectional view taken along a direction III-III' of FIG. 1.

FIG. 2A is a longitudinal sectional view taken along a direction I-I' of FIG. 1, FIG. 2B is a longitudinal sectional view taken along a direction II-II' of FIG. 1, and FIG. 2C is a longitudinal sectional view taken along a direction III-III' of FIG. 1.

Referring to FIG. 2A, the semiconductor device 100 according to the embodiments of the inventive concept may include the gate patterns 140, the channel regions 120, the active regions 125, a lower interlayer insulating layer 190, and an upper interlayer insulating layer 195, which may be disposed on the substrate 101. Inner spacers 150 and outer spacers 160 may be respectively formed on side surfaces of the gate patterns 140.

The substrate 101 may include a bulk single crystalline silicon wafer. The substrate 101 may also include protruding channel regions 120 and protruding active regions 125. The channel regions 120 may protrude from the substrate 101. Each of the channel regions 120 may be a portion of the substrate 101. For example, the channel regions 120 may be materially continuous with the substrate 101. The channel regions 120 may include a low channel region 121, which may protrude at a relatively low level, and a high channel region 122. For example, the low channel region 121 may have a relatively low surface level, and the high channel region 122 may have a relatively high surface level.

Each of the active regions 125 may be formed on the low channel region 121. For instance, each of the active regions 125 may be formed between the high channel regions 122. The active region 125 may be materially discontinuous with the substrate 101 and the channel region 120. For instance, the active region 125 may include epitaxially grown silicon germanium (SiGe). A top surface of each of the active regions 125 may be disposed at a higher level than a top surface of each of the high channel regions 122. Each of the active regions 125 may provide a source or a drain. For example, the active regions 125 disposed on both sides of the high channel region 122, the gate pattern 140, and the channel region 120 may form a single transistor.

The gate patterns 140 may be respectively formed on the high channel regions 122 of the channel regions 120. For example, each of the gate patterns 140 may be formed on a top surface and two side surfaces of the corresponding high channel region 122 to surround the corresponding high channel region 122. Each of the gate patterns 140 may include a surface insulating pattern 141, a gate insulating pattern 142, a barrier pattern 143, a lower gate electrode 144, and an upper gate electrode 145.

The surface insulating pattern 141 may be directly formed on the channel regions 120. A longitudinal section of the surface insulating pattern 141 may have a horizontal bar shape, while a cross-section of the surface insulating pattern 141 may have a line or square shape. The surface insulating pattern 141 may include thermally oxidized silicon. For example, the surface of the substrate 101 may be oxidized using a thermal oxidation process to form the surface insulating pattern 141. In other embodiments, the surface insulating pattern 141 may be omitted.

The gate insulating pattern 142 may be formed on the surface insulating pattern 141. A longitudinal section of the gate insulating pattern 142 may have a U shape. For example, an outer side surface of the gate insulating pattern 142 may be in contact with an inner side surface of the inner spacer 150. The gate insulating pattern 142 may include a high-k dielectric insulator, such as hafnium oxide (HfO), aluminum oxide (AlO), zirconium oxide (ZrO), lanthanum oxide (LaO), or other metal oxides.

The barrier pattern 143 may be formed on the gate insulating pattern 142. A longitudinal section of the barrier pattern 143 may have a U shape. For example, an outer side surface of the barrier pattern 143 may be in contact with an inner side surface of the gate insulating pattern 142. The barrier pattern 143 may include a barrier metal, such as titanium (Ti), titanium nitride (TiN), tantalum (Ta), tantalum nitride (TaN), or titanium tungsten (TiW).

The lower gate electrode 144 may be formed on the barrier pattern 143. A longitudinal section of the lower gate electrode 144 may have a U shape. For instance, an outer side surface of the lower gate electrode 144 may be in contact with an inner side surface of the barrier pattern 143. The lower gate electrode 144 may have a multilayered structure. For example, the lower gate electrode 144 may include at least two conductive layers formed of, for example, a titanium-aluminum (TiAl) alloy, titanium nitride (TiN), or aluminum-titanium oxide (AlTiO).

The upper gate electrode 145 may be formed on the lower gate electrode 144. Side and bottom surfaces of the upper gate electrode 145 may be surrounded with the lower gate electrode 144. The upper gate electrode 145 may include a highly conductive metal, such as tungsten (W) or copper (Cu).

The inner spacer 150 may be in contact with a side end portion of the surface insulating pattern 141 and the outer side surface of the gate insulating pattern 142. The inner spacer 150 may include silicon nitride.

The outer spacer 160 may be formed on an outer side surface of the inner spacer 150. The outer spacer 160 may include an upper outer spacer 161 and a lower outer spacer 165 having different dielectric constants. For example, the upper outer spacer 161 may include silicon nitride having a relatively high dielectric constant, and the lower outer spacer 165 may include silicon oxide having a relatively low dielectric constant. A sidewall of the upper outer spacer 161 may be vertically aligned with a sidewall of the lower outer spacer 165. The lower outer spacer 165 may be disposed between the gate pattern 140 and the active region 125 at a horizontal level. A side surface of the outer spacer 160 may be vertically aligned with a side surface of the high channel region 122 or a side surface of the active region 125. For example, the side surface of the outer spacer 160 may be vertically aligned with an interfacial surface between the high channel region 122 and the active region 125. The interfacial surface between the high channel region 122 and the active region 125 and an interfacial surface between the low channel region 121 and the active region 125 are illustrated with dotted lines.

The lower interlayer insulating layer 190 may cover the active region 125 and surround a side surface of the gate pattern 140. A top surface of the lower interlayer insulating layer 190 may be coplanar with a top surface of the gate pattern 140.

The upper interlayer insulating layer 195 may cover the lower interlayer insulating layer 190 and the gate pattern 140. The lower interlayer insulating layer 190 and the upper interlayer insulating layer 195 may include silicon oxide.

The semiconductor device 100 may further include a stopper layer 193 interposed between the lower interlayer insulating layer 190 and the upper interlayer insulating layer 195. The stopper layer 193 may include a harder insulator than the lower interlayer insulating layer 190 and the upper interlayer insulating layer 195. For instance, the stopper layer 193 may include silicon nitride.

Referring to FIG. 2B, the active region 125 may be formed on the channel region 120. The active region 125 may have a diamond-shaped longitudinal section. As shown by FIG. 2B, the semiconductor device 100 may include a device isolation insulator 130 formed between the active regions 125. The device isolation insulator 130 may include silicon oxide. The active region 125 may have a greater maximum width than the channel region 120. The semiconductor device 100 may further include a molding 135 disposed adjacent to the channel region 120 under the active region 125. The molding 135 may have a stick shape or a bar shape. The molding 135 may include oxidized silicon or silicon oxide, which is harder and denser than the device isolation insulator 130. Alternatively, the molding 135 may be materially continuous with the device isolation insulator 130. The molding 135 may include silicon nitride. A detailed description of the molding 135 will be described later.

Referring to FIG. 2C, the device isolation insulator 130 may be formed between the channel regions 120. The device isolation insulator 130 may be disposed at the same horizontal level as the low channel region 121. The gate pattern 140 may be formed on the top and side surfaces of the high channel regions 122. The surface insulating pattern 141 may be formed only on the top and side surfaces of the high channel region 122. The gate insulating pattern 142 may be formed on the surface insulating pattern 141 and the device isolation insulator 130. The gate insulating pattern 142, the barrier pattern 143, the lower gate electrode 144, and the upper gate electrode 145 may surround the top and side surfaces of the high channel region 122. For instance, the gate insulating pattern 142, the barrier pattern 143, the lower gate electrode 144, and the upper gate electrode 145 may be bent to fill a space between the high channel regions 122.

Since the semiconductor device 100 according to the embodiments of the inventive concept includes the lower outer spacer 165 having a low dielectric constant between the gate pattern 140 and the active region 125, a delay caused by a parasitic capacitance may be reduced. Accordingly, operating speed and power consumption of the semiconductor device 100 may be improved.

Since the semiconductor device 100 according to the embodiments of the inventive concept includes the channel region 120 formed of single crystalline silicon and the active region 125 formed of SiGe, carrier mobility may be improved.

Since the semiconductor device 100 according to the embodiments of the inventive concept has the protruding channel region 120, a channel width may increase due to the gate pattern 140. Thus, driving speed and capability of a transistor may be excellent.

Figure 19:
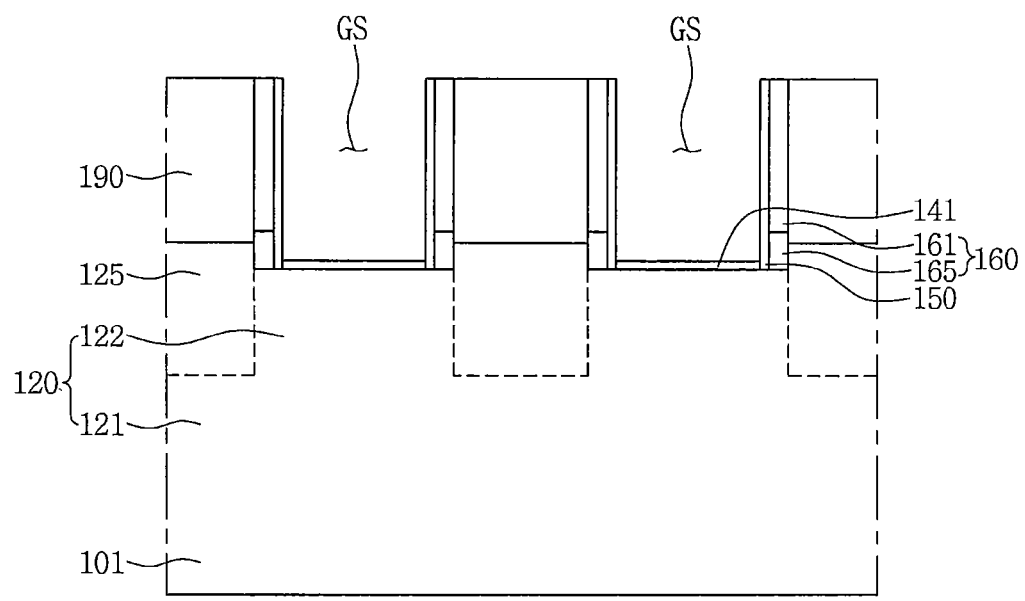
FIGS. 19 through 21 are longitudinal sectional views taken along the direction I-I' of FIG. 1 or the direction IV-IV' of FIG. 9, which illustrate the method of fabricating the semiconductor device as illustrated in FIGS. 3 through 9.
Figure 20:
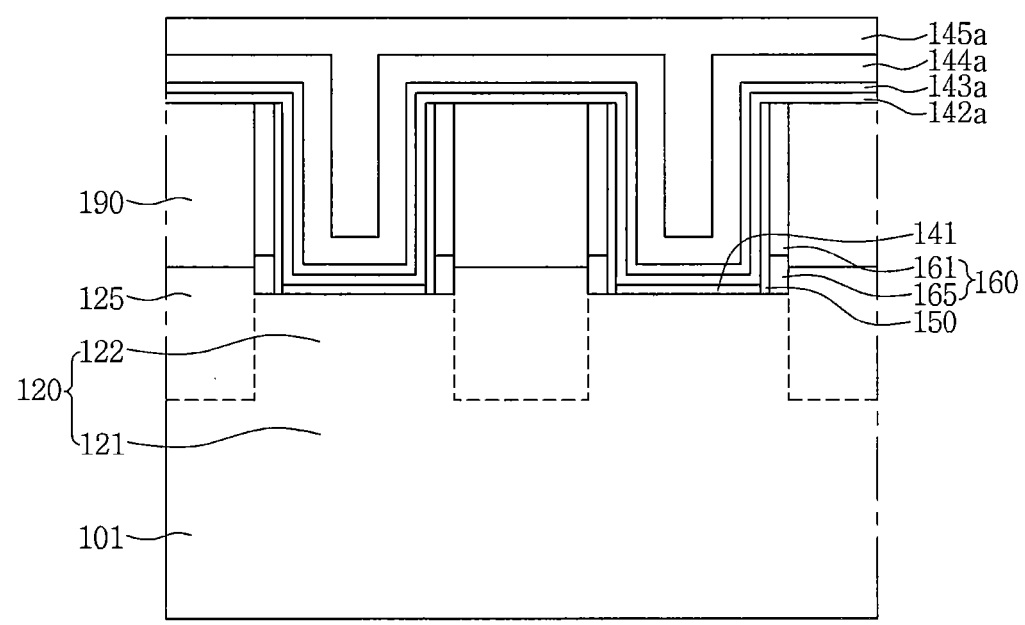
Figure 21:
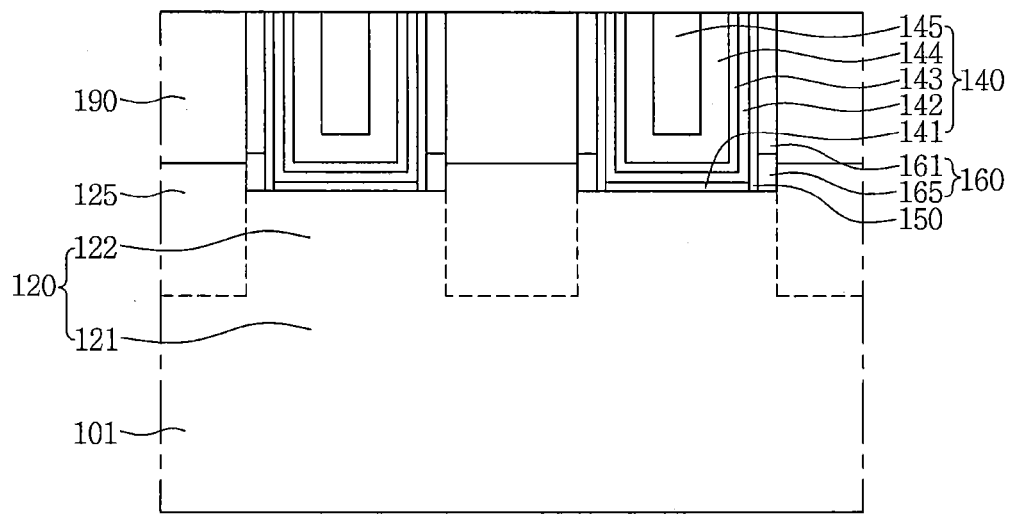

FIGS. 3 through 9 are perspective views illustrating a method of fabricating a semiconductor device according to embodiments of the inventive concept. FIGS. 10A through 18A are longitudinal sectional views taken along the direction I-I' of FIG. 1 or a direction IV-IV' of FIG. 9, which illustrate the method of fabricating the semiconductor device as illustrated in FIGS. 3 through 9. FIGS. 10B through 18B are longitudinal sectional views taken along the direction II-II' of FIG. 1 or a direction V-V' of FIG. 9, which illustrate the method of fabricating the semiconductor device as illustrated in FIGS. 3 through 9. FIGS. 19 through 21 are longitudinal sectional views taken along the direction I-I' of FIG. 1 or the direction IV-IV' of FIG. 9, which illustrate the method of fabricating the semiconductor device as illustrated in FIGS. 3 through 9.

Figure 3:
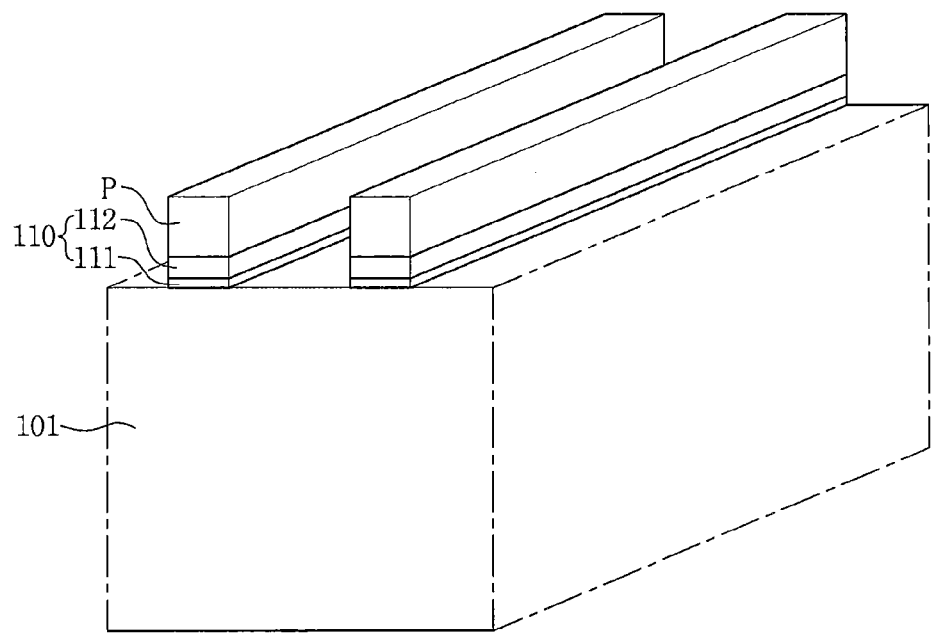
FIGS. 3 through 9 are perspective views illustrating a method of fabricating a semiconductor device according to embodiments of the inventive concept.

Referring to FIG. 3, a method of fabricating a semiconductor device according to embodiments of the inventive concept may include preparing a substrate 101 and forming a recess mask 110 on the substrate 101. The substrate 101 may include single crystalline silicon. The recess mask 110 may include a lower mask layer 111 and an upper mask layer 112. The lower mask layer 111 may include silicon oxide, and the upper mask layer 112 may include silicon nitride. The forming the recess mask 110 may include forming a photoresist pattern P using a photolithography process and selectively removing the upper mask layer 112 and the lower mask layer 111 by etching using the photoresist pattern P. Subsequently, the photoresist pattern P may be removed.

Figure 4:
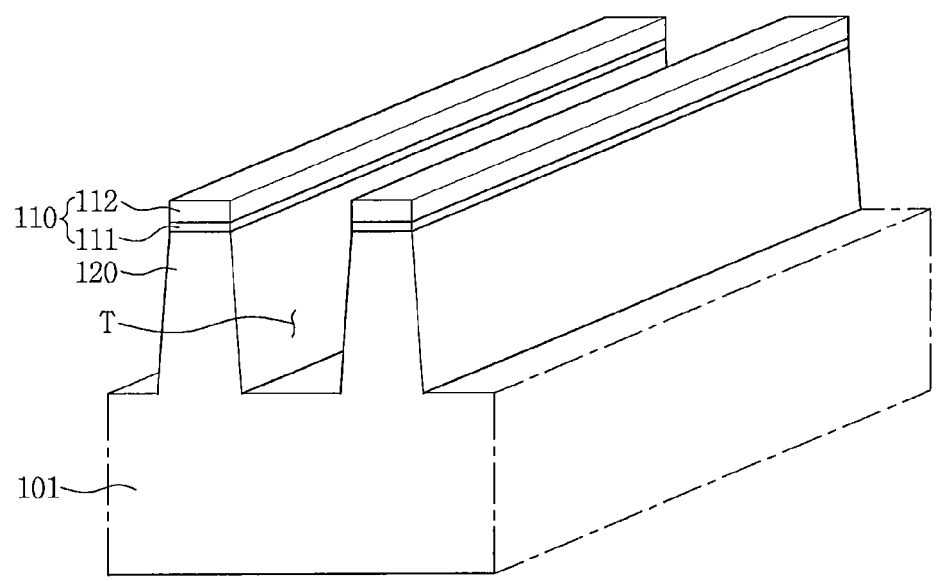

Referring to FIG. 4, the method may include selectively etching and recessing the substrate 101 using the recess mask 110 as an etch mask to form a protruding fin-type channel region 120 and a trench T. Side surfaces of the channel region 120 may be inclined.

Figure 5:
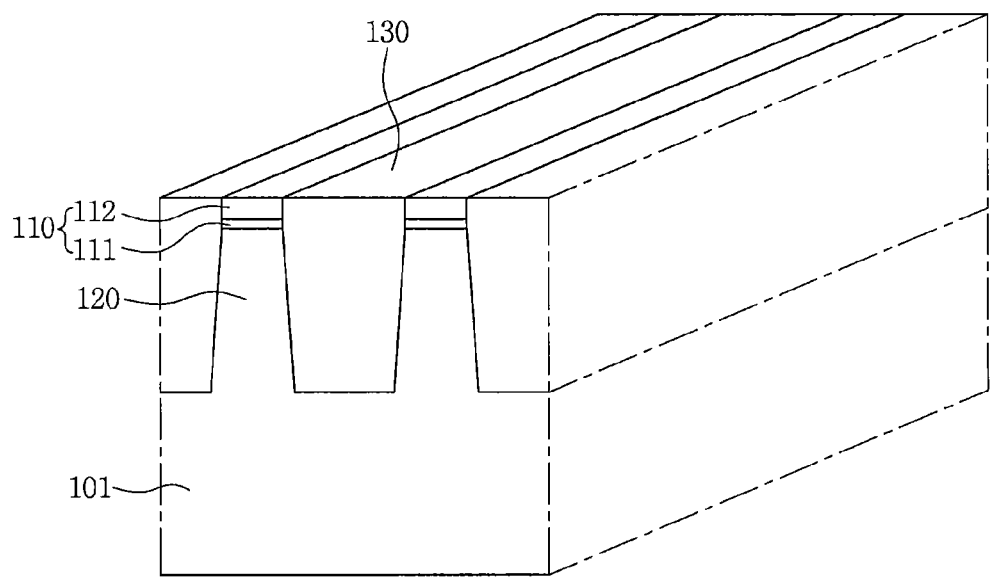

Referring to FIG. 5, the method may include filling the trench T with a device isolation insulator 130 and performing a planarization process, such as a chemical mechanical polishing (CMP), to co-planarize a top surface of the recess mask 110 and the surface of the device isolation insulator 130 until the surface of the upper mask layer 112 of the recess mask 110 is exposed. The device isolation insulator 130 may include silicon oxide. Subsequently, the method may include removing the recess mask 110.

Figure 6:
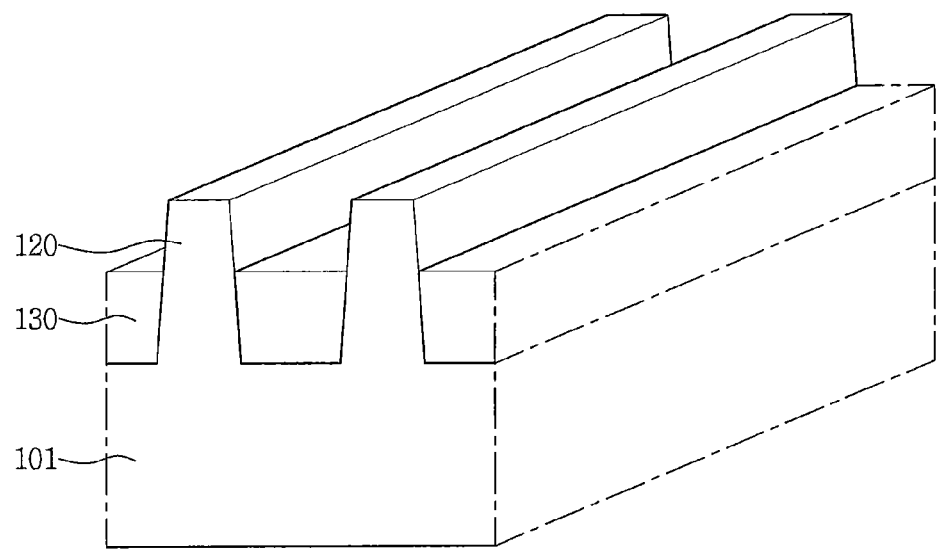

Referring to FIG. 6, the method may include recessing a top surface of the device isolation insulator 130 using an etchback process to be at a lower level than a top surface of the channel region 120. For example, the device isolation insulator 130 may partially fill the trench T. In addition, the method may further include densifying the device isolation insulator 130 using a heating process between the planarization process and the etchback process. Due to the densification process, an oxidized silicon layer may be formed on the surfaces of the channel region 120 and the trench T. For example, silicon contained in the surface of the substrate 101 in contact with the device isolation insulator 130 may be wholly oxidized to a small thickness. The oxidized silicon layer may be formed on the surface of the substrate 101 to a small thickness of about several tens Å. For simplicity of illustration, the oxidized silicon layer is omitted in the drawings.

Figure 7:
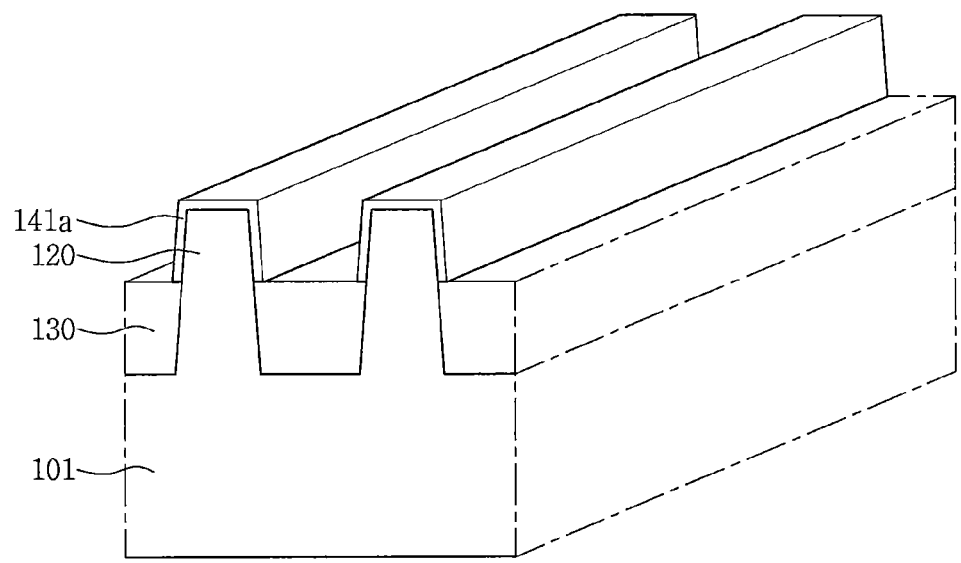

Referring to FIG. 7, the method may include forming a surface insulating layer 141a on the surface of the exposed channel region 120. The surface insulating layer 141a may be formed by oxidizing the surface of the channel region 120 using a thermal oxidation process. Accordingly, the surface insulating layer 141a may include thermally oxidized silicon. The surface insulating layer 141a may be formed also in the surface of the channel region 120. For simplicity of illustration, the surface insulating layer 141a is illustrated only on the surface of the channel region 120.

Figure 8:
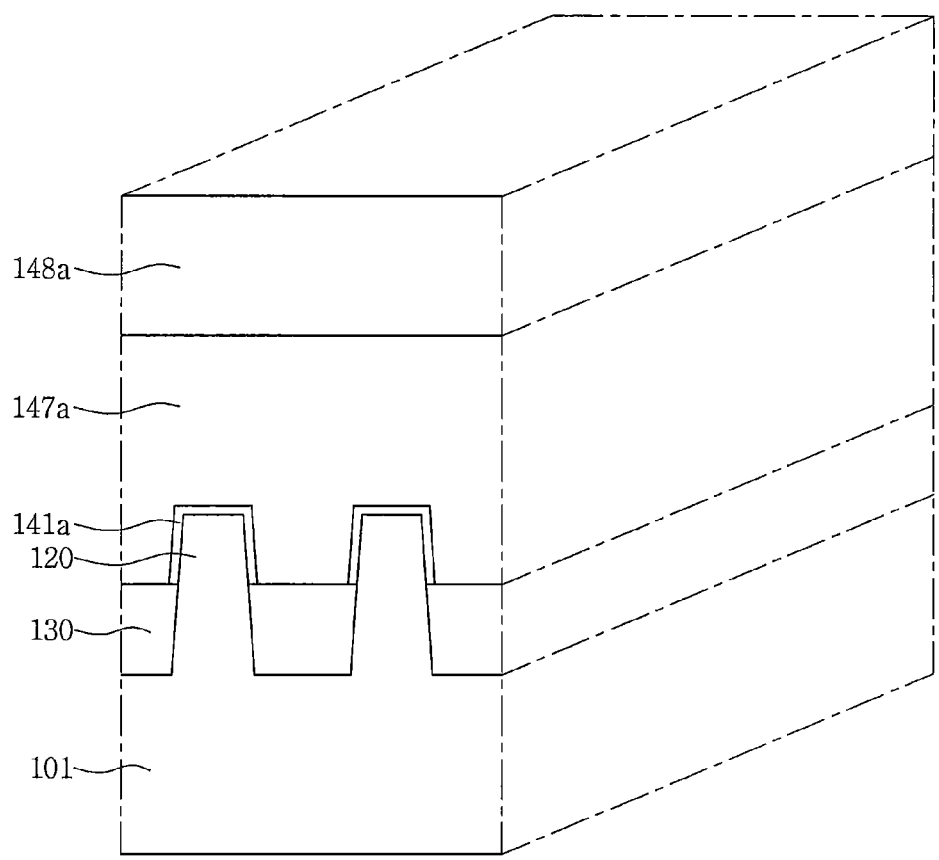

Referring to FIG. 8, the method may include forming a sacrificial gate electrode material layer 147a on the surface insulating layer 141a and the device isolation insulator 130, planarizing a top surface of the sacrificial gate electrode material layer 147a, forming a sacrificial gate capping layer 148a on the sacrificial gate electrode material layer 147a, and planarizing a top surface of the sacrificial gate capping layer 148a. The sacrificial gate electrode material layer 147a may include polycrystalline silicon (poly-Si), and the sacrificial gate capping layer 148a may include silicon nitride.

Figure 9:
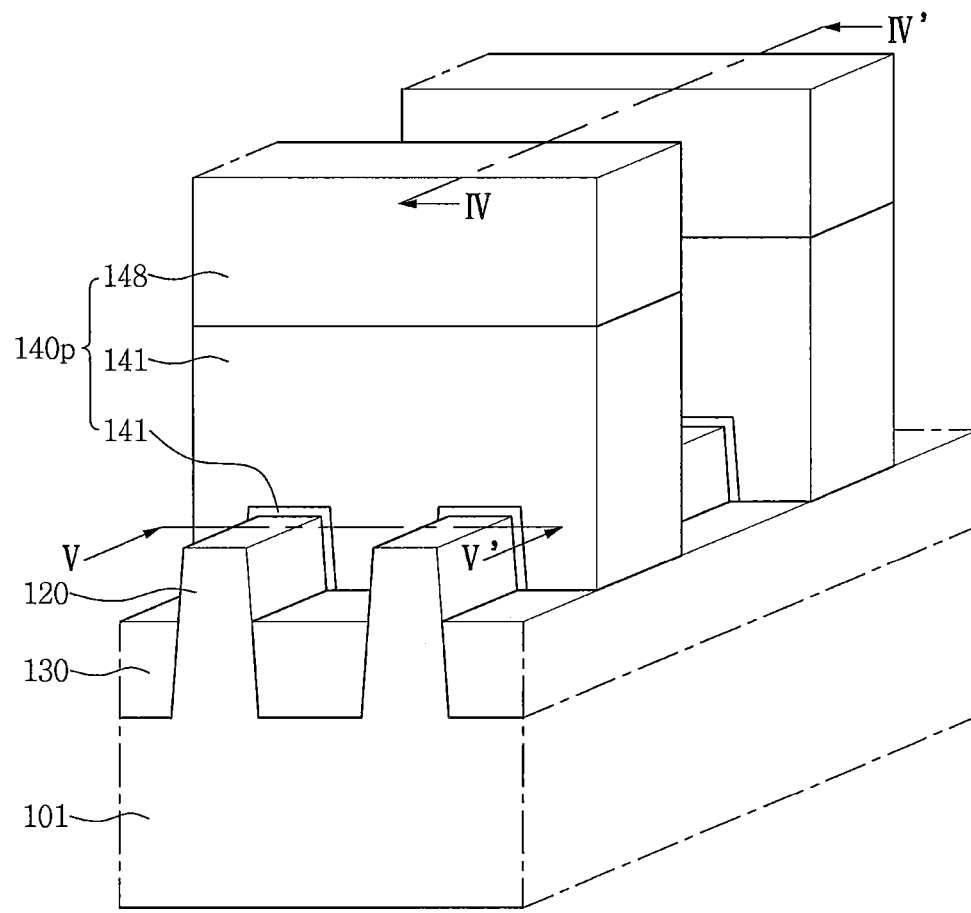

Referring to FIG. 9, the method may include forming a preliminary gate pattern 140p using a photolithography process and an etching process. The preliminary gate pattern 140p may include a surface insulating pattern 141 formed on the surface of the channel region 120, a sacrificial gate electrode pattern 147 formed on the surface insulating pattern 141 and the device isolation insulator 130, and a sacrificial gate capping pattern 148 formed on the sacrificial gate electrode pattern 147.

Figure 10A:
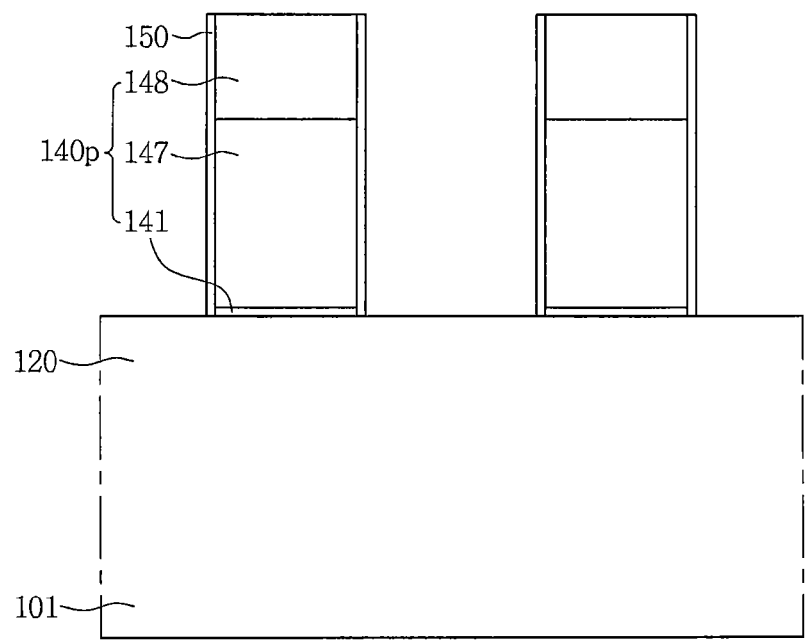
Figure 10B:
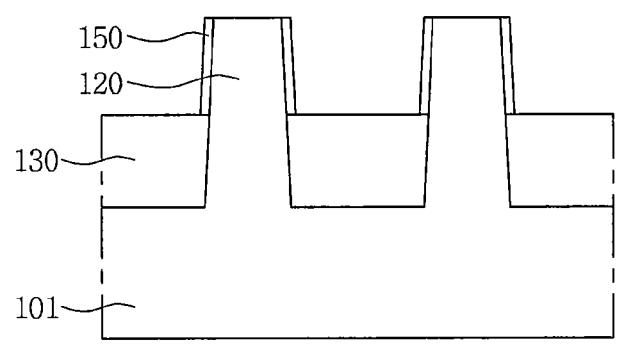

Referring to FIGS. 10A and 10B, the method may include forming inner spacers 150 on side surfaces of the preliminary gate pattern 140p and exposed side surfaces of the channel region 120. For instance, the forming the inner spacers 150 may include blanketly conformally forming silicon nitride on top and side surfaces of the preliminary gate pattern 140p, the exposed top and side surfaces of the channel region 120, and the surface of the device isolation insulator 130 and removing silicon nitride from the top surface of the preliminary gate pattern 140p, the top surface of the channel region 120, and the surface of the device isolation insulator 130 using an etchback process.

Figure 11A:
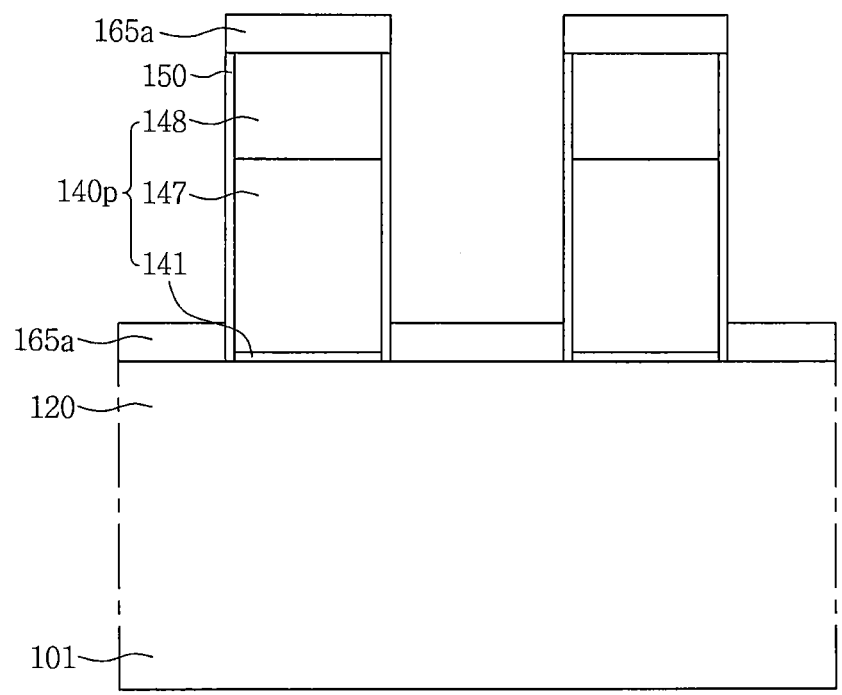
Figure 11B:
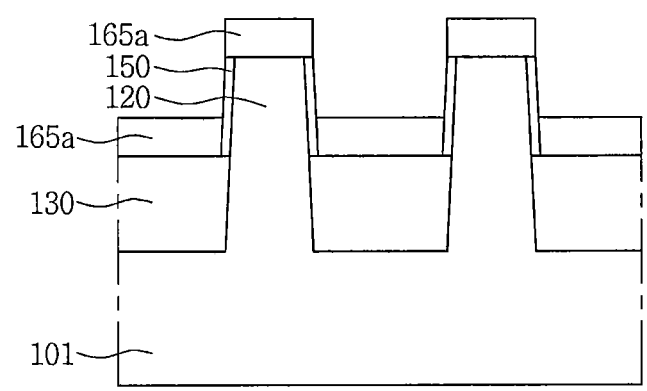

Referring to FIGS. 11A and 11B, the method may include forming a buffer layer 165a on the top surface of the preliminary gate pattern 140p, the exposed top surface of the channel region 120, and the surface of the device isolation insulator 130. The buffer layer 165a may be formed to a relatively small thickness or may not be formed on the inner spacers 150 formed on the side surfaces of the preliminary gate pattern 140p and the inner spacers 150 formed on the side surfaces of the channel region 120. The buffer layer 165a may include silicon oxide deposited using a cluster ion-beam process.

Figure 12A:
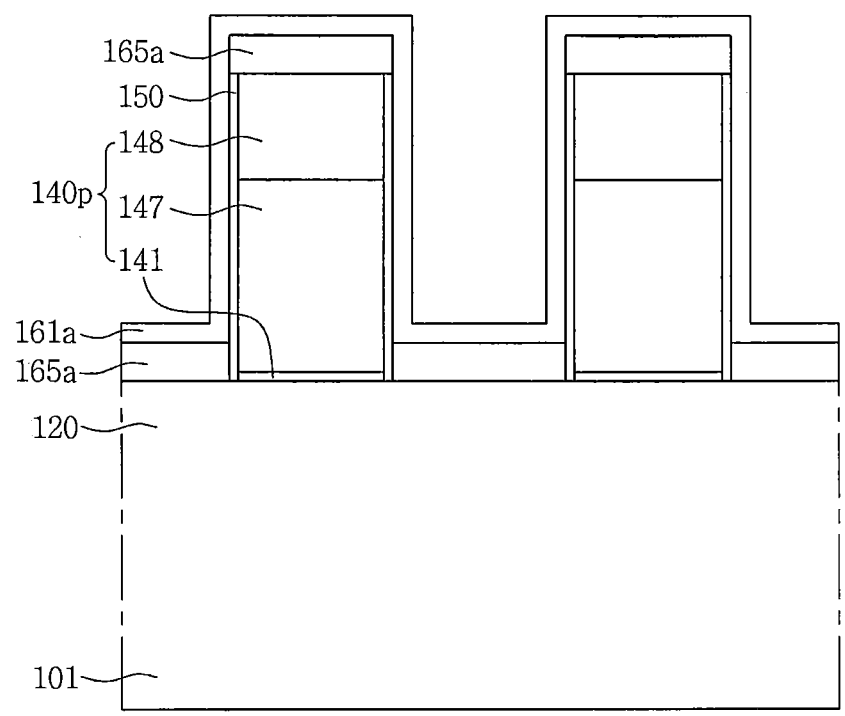
Figure 12B:
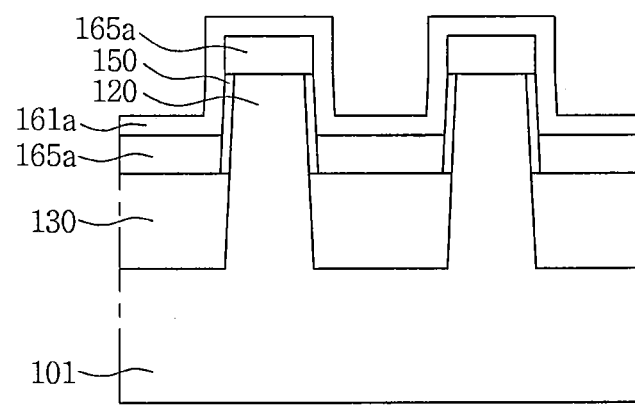

Referring to FIGS. 12A and 12B, the method may include blanketly forming an upper outer spacer material layer 161a. The upper outer spacer material layer 161a may be conformally formed on the inner spacers 150 and the buffer layer 165a. The upper outer spacer material layer 161a may include silicon nitride.

Figure 13A:
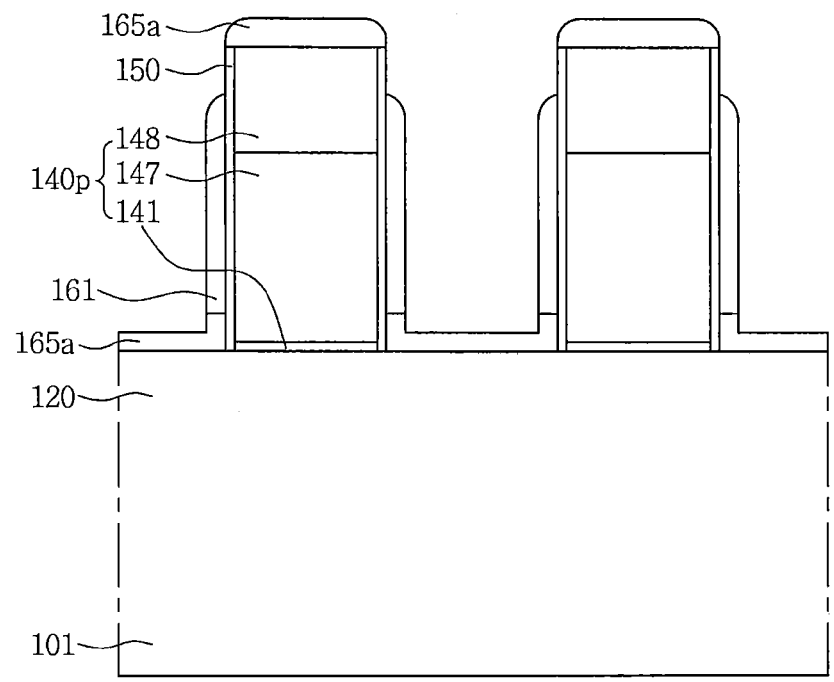
Figure 13B:
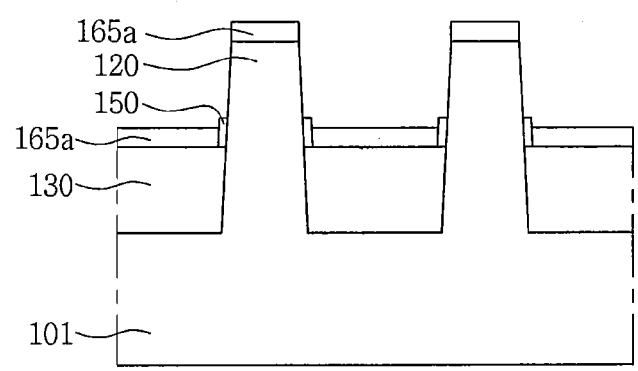

Referring to FIGS. 13A and 13B, the method may include forming upper outer spacers 161 on side surfaces of the inner spacers 150 using an etchback process. The buffer layer 165a formed on the preliminary gate pattern 140p and the buffer layer 165a formed on the device isolation insulator 130 may be exposed. Top end portions of the upper outer spacers 161 may be disposed beside the sacrificial gate capping pattern 148. The etchback process may be sufficiently performed to expose upper portions of the inner spacers 150. Accordingly, exposed portions of the buffer layer 165a may be recessed to a lower level than unexposed portions thereof. Referring back to FIG. 13B, the upper outer spacer material layer 161a and the inner spacers 150 may be removed to expose the side surfaces of the channel region 120. Also, portions of the inner spacers 150 may remain protruding around a lower portion of the channel region 120.

Figure 14A:
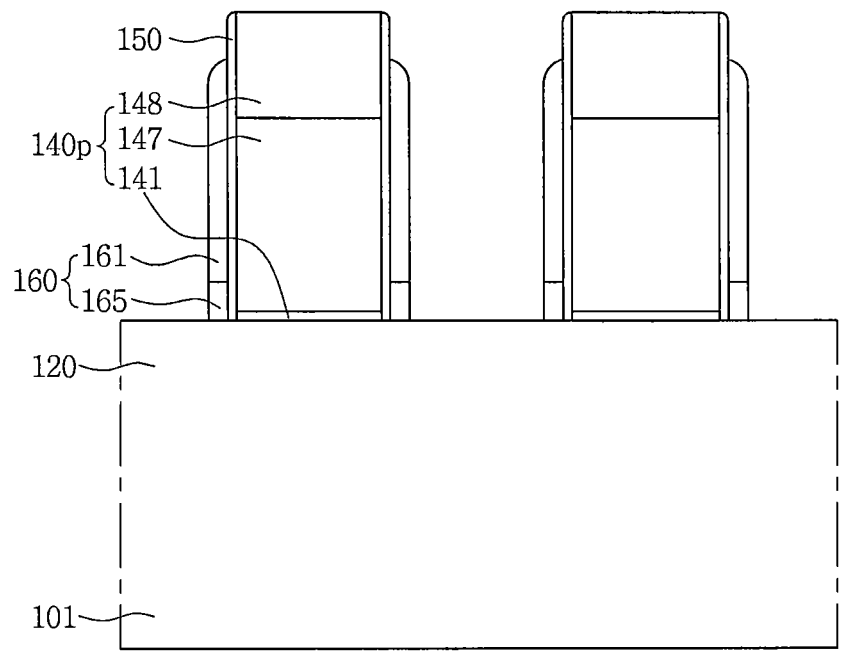
Figure 14B:
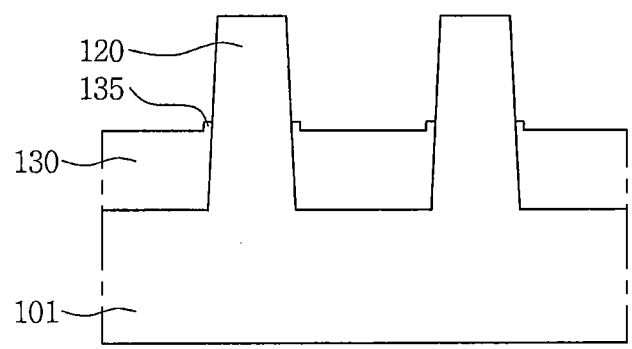

Referring to FIGS. 14A and 14B, the method may include etching back the buffer layer 165a to expose the top surface of the channel region 120. During the current process, lower outer spacers 165 may be formed. The exposed buffer layer 165a may be completely removed, and the buffer layer 165a disposed under the upper outer spacers 161 may be remained and modified into the lower outer spacers 165. Accordingly, outer spacers 160 including the upper outer spacers 161 and the lower outer spacers 165 may be formed. Since the buffer layer 165a and the surface insulating pattern 141 commonly contain silicon oxide, exposed portions of the surface insulating pattern 141 also may be removed. Referring back to FIG. 14B, moldings 135 may be formed at lower portions of the channel region 120. The moldings 135 may be portions of the surface insulating pattern 141 or portions of the device isolation insulator 130 according to the etchback process. For example, when the etchback process is sufficiently excessively performed, the moldings 135 may be the portions of the device isolation insulator 130, and when the etchback process is not sufficiently excessively performed, the moldings 135 may be the portions of the surface insulating pattern 141. In either case, the moldings 135 may include silicon oxide.

Figure 15A:
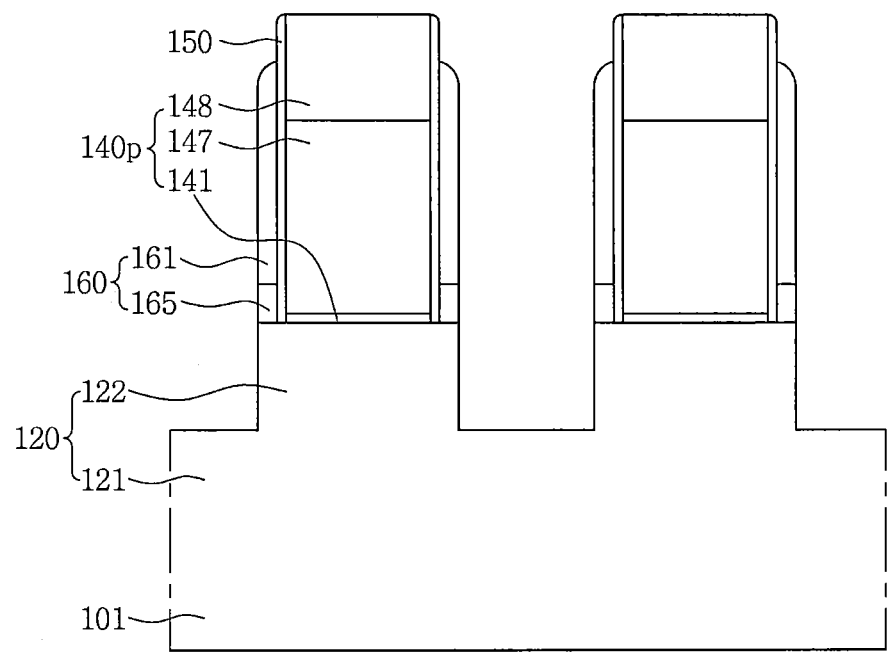
Figure 15B:
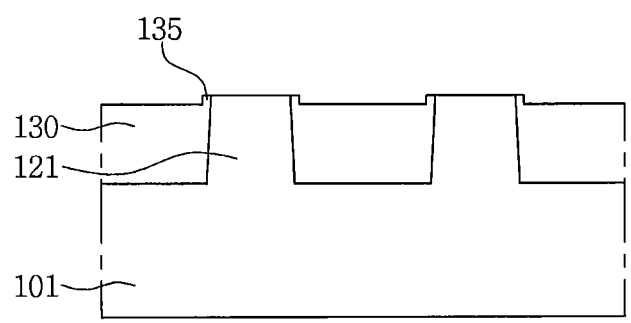

Referring to FIGS. 15A and 15B, the method may include removing or recessing the exposed channel region 120 to define low channel regions 121 and high channel regions 122. A top surface of the removed or recessed low channel region 121 may be disposed at a similar surface level to top surfaces of the moldings 135 or a top surface of the device insulation insulator 130.

Figure 16A:
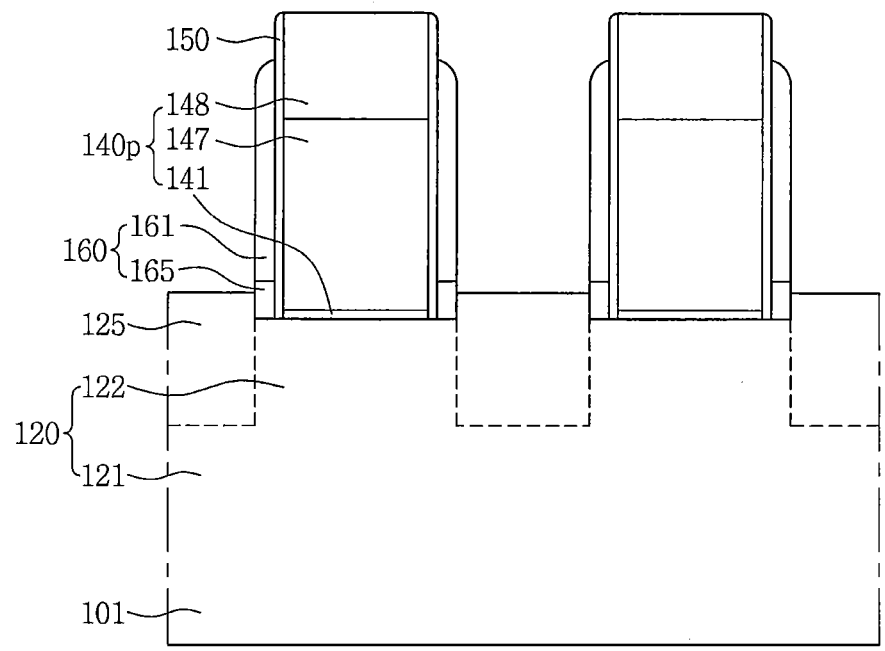
Figure 16B:
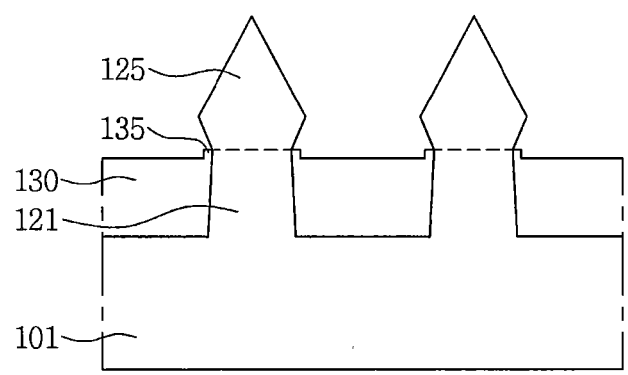

Referring to FIGS. 16A and 16B, the method may include forming active regions 125 on the low channel regions 121 using an epitaxial growth process. The active regions 125 may include SiGe. Each of the active regions 125 may have a diamond-shaped longitudinal section.

Figure 17A:
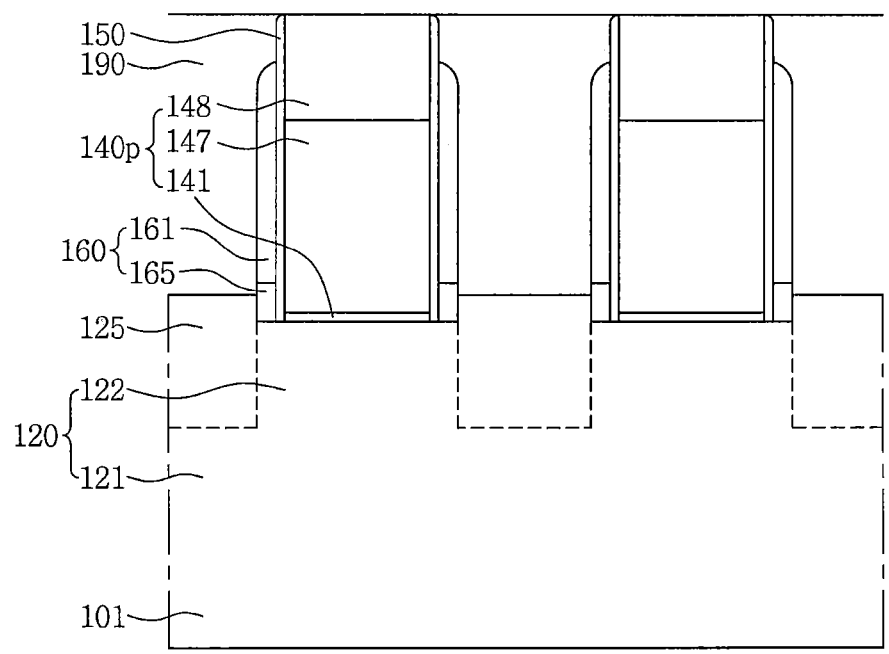
Figure 17B:
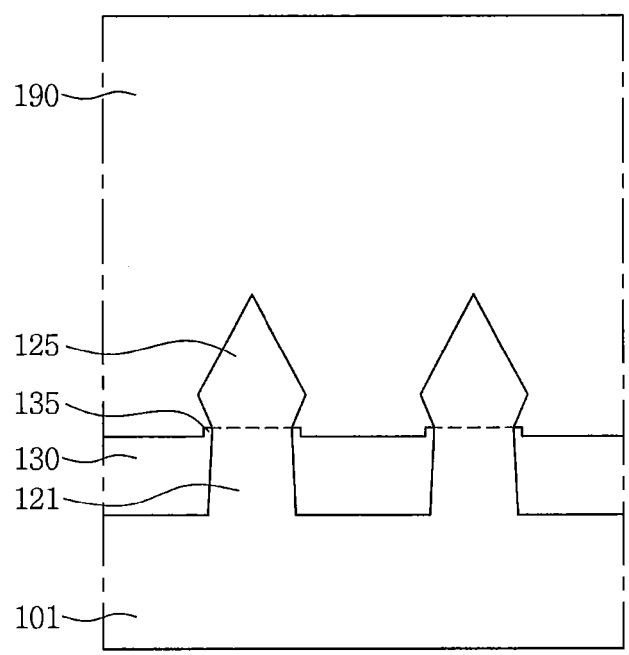

Referring to FIGS. 17A and 17B, the method may include forming a lower interlayer insulating layer 190 and exposing the sacrificial gate capping pattern 148 using a planarization process, such as a chemical mechanical polishing (CMP) process. The lower interlayer insulating layer 190 may include silicon oxide. The CMP process may include removing silicon oxide and employing silicon nitride as a stop layer.

Figure 18A:
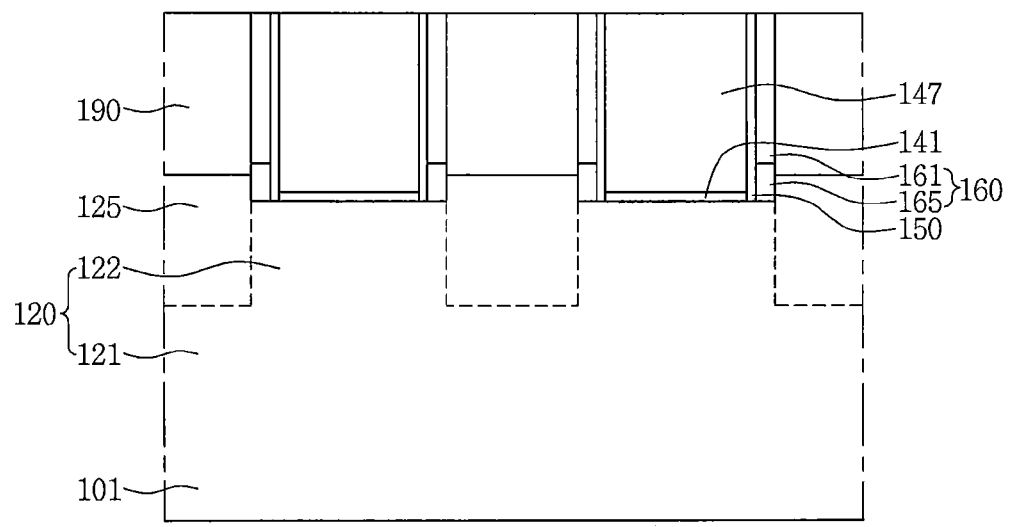
Figure 18B:
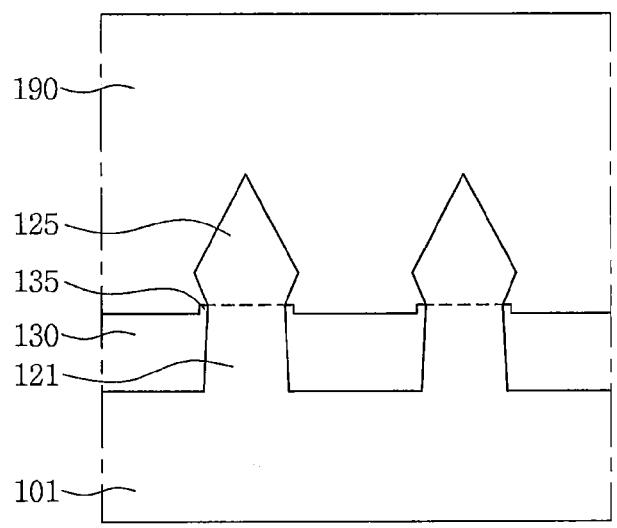

Referring to FIGS. 18A and 18B, the method may include a planarization process, such as a CMP process, once again or continuously to expose the sacrificial gate electrode pattern 147. The CMP process may include removing silicon oxide and silicon nitride and employing silicon as a stop layer.

Referring to FIG. 19, the method may include removing the exposed sacrificial gate electrode pattern 147 to form gate electrode spaces GS exposing inner surfaces of the inner spacers 150 and the surface insulating patterns 141.

Referring to FIG. 20, the method may include filling the gate electrode spaces GS with a gate insulating layer 142a, a barrier layer 143a, a lower gate electrode layer 144a, and an upper gate electrode layer 145a. The gate insulating layer 142a may include a high-k dielectric insulating material, such as hafnium oxide (HfO), zirconium oxide (ZrO), or other metal oxides. The barrier layer 143a may include a barrier metal, such as titanium (Ti), titanium nitride (TiN), tantalum (Ta), tantalum nitride (TaN), or titanium tungsten (TiW). The lower gate electrode layer 144a may include a multilayered metal layer, a metal alloy layer, and/or metal compound layers. The upper gate electrode layer 145a may include a metal, such as tungsten (W) or copper (Cu).

Referring to FIG. 21, the method may include removing the upper gate electrode layer 145a, the lower gate electrode layer 144a, the barrier layer 143a, and the gate insulating layer 142a disposed on the lower interlayer insulating layer 190 using a planarization process, such as a CMP process, to form a gate pattern 140 including a gate insulating pattern 142, a barrier pattern 143, a lower gate 144, and an upper gate electrode 145.

Subsequently, referring back to FIG. 2A, the method may include blanketly forming an upper interlayer insulating layer 195. The upper interlayer insulating layer 195 may include silicon oxide. In addition, before forming the upper interlayer insulating layer 195, the method may further include forming a stopper layer 193 on the gate pattern 140 and the lower interlayer insulating layer 190. The stopper layer 193 may include silicon nitride.

Figure 22A:
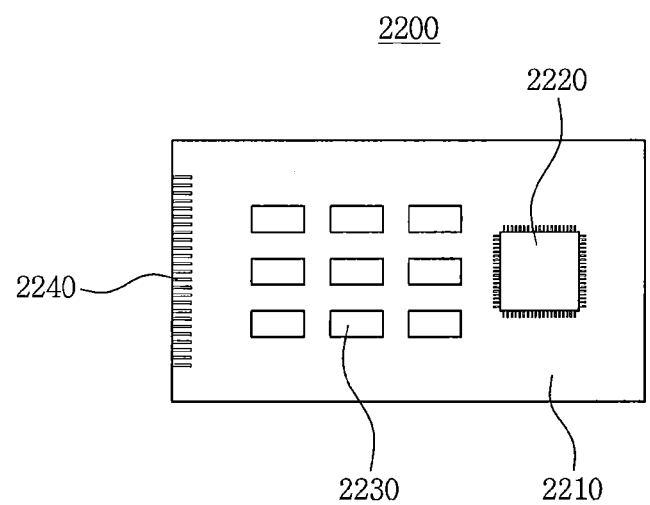
FIG. 22A is a conceptual diagram of a semiconductor module according to embodiments of the inventive concept.

FIG. 22A is a conceptual diagram of a semiconductor module 2200 according to embodiments of the inventive concept. Referring to FIG. 22A, the semiconductor module 2200 according to the embodiments of the inventive concept may include a processor 2220 and semiconductor devices 2230 mounted on a module substrate 2210. The processor 2220 or the semiconductor devices 2230 may include at least one of semiconductor devices according to various embodiments of the inventive concept. Input/output (I/O) terminals 2240 may be disposed on at least one side of the module substrate 2210.

Figure 22B:
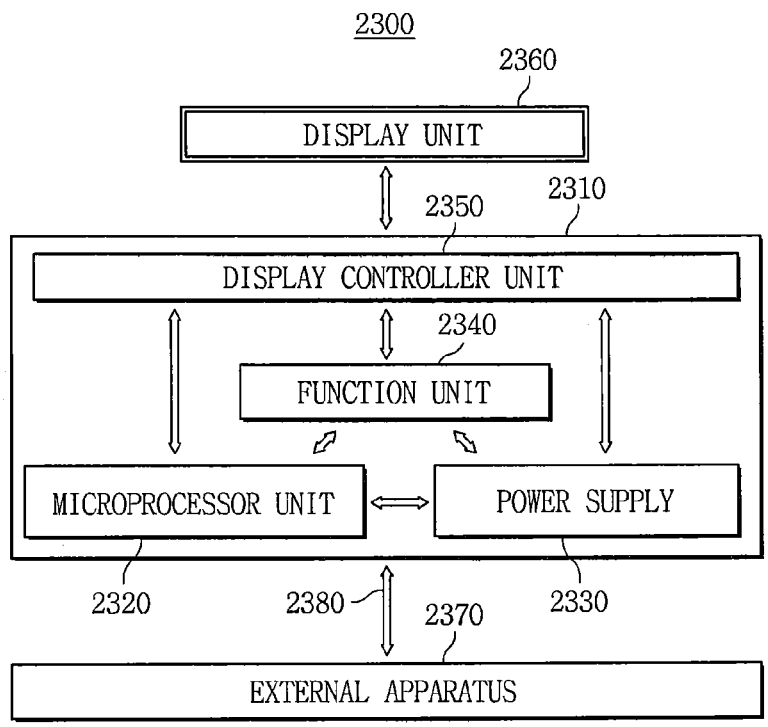
FIGS. 22B and 22C are conceptual block diagrams of electronic systems according to embodiments of the inventive concept.
Figure 22C:
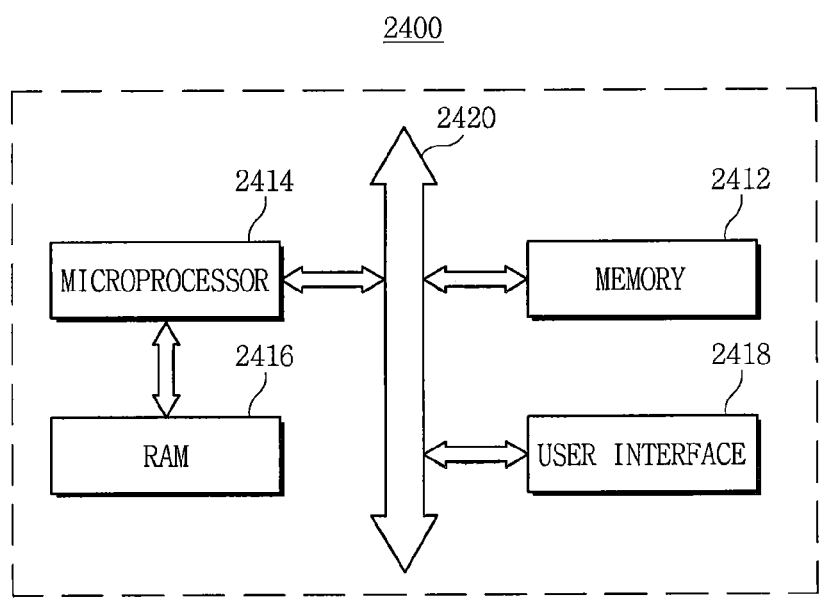

FIGS. 22B and 22C are conceptual block diagrams of electronic systems 2300 and 2400 according to embodiments of the inventive concept. Referring to FIG. 22B, the electronic system 2300 according to the embodiments of the inventive concept may include a body 2310, a display unit 2360, and an external apparatus 2370.

The body 2310 may include a microprocessor (MP) unit 2320, a power supply 2330, a function unit 2340, and/or a display control unit 2350. The body 2310 may include a system board or motherboard having a printed circuit board (PCB) and/or a case. The MP unit 2320, the power supply 2330, the function unit 2340, and the display control unit 2350 may be mounted or disposed on a top surface of the body 2310 or in the body 2310. The display unit 2360 may be disposed on the top surface of the body 2310 or inside/outside the body 2310.

The display unit 2360 may display an image processed by the display control unit 2350. For example, the display unit 2360 may include a liquid crystal display (LCD), an active-matrix organic light emitting diode (AMOLED), or various display panels. The display unit 2360 may include a touchscreen. Accordingly, the display unit 2360 may have an input/output (I/O) function.

The power supply 2330 may supply currents or voltages to the MP unit 2320, the function unit 2340, and the display control unit 2350. The power supply 2330 may include a charging battery, a battery socket, or a voltage-to-current converter.

The MP unit 2320 may receive a voltage from the power supply 2330 and control the function unit 2340 and the display unit 2360. For example, the MP unit 2320 may include a central processing unit (CPU) or an application processor (AP).

The function unit 2340 may implement various functions of the electronic system 2300. For example, the function unit 2340 may include a touchpad, a touchscreen, a volatile/non-volatile memory, a memory card controller, a camera, a light, a voice/moving image reproduction processor, a wireless transceiving antenna, a speaker, a mike, a universal serial bus (USB) port, or units having various other functions.

The MP unit 2320 or the function unit 2340 may include at least one of semiconductor devices according to various embodiments of the inventive concept.

Referring to FIG. 22C, the electronic system 2400 according to the embodiments of the inventive concept may include a MP 2414, a memory system 2412, and a user interface 2418, which may perform data communication through a bus 2420. The MP 2414 may include a CPU or an AP. The electronic system 2400 may further include a random access memory (RAM) 2416 configured to directly communicate with the MP 2414. The MP 2414 and/or the RAM 2416 may be assembled in a single package. The user interface 2418 may be used to input information to the electronic system 2400 or output information from the electronic system 2400. For instance, the user interface 2418 may include a touchpad, a touchscreen, a keyboard, a mouse, a scanner, a voice detector, a cathode ray tube (CRT) monitor, an LCD, an AMOLED, a plasma display panel (PDP), a printer, a light, or various other I/O devices. The memory system 2412 may store codes for operating the MP 2414, data processed by the MP 2414, or external input data. The memory system 2412 may include a memory controller, a hard disk, or a solid-state drive (SSD). The MP 2414, the RAM 2416, and/or the memory system 2412 may include at least one of semiconductor devices according to various embodiments of the inventive concept.

Since a semiconductor device according to embodiments of the inventive concept includes spacers having a low dielectric constant between a gate pattern and an active region, a delay caused by a parasitic capacitance can be reduced. Accordingly, operating speed and power consumption of the semiconductor device can be improved.

Since a semiconductor device according to embodiments of the inventive concept includes a channel region formed of single crystalline silicon and an active region formed of SiGe, carrier mobility can be improved.

Since a semiconductor device according to embodiments of the inventive concept includes a protruding channel region, the channel width of a gate pattern can increase so that a transistor can have high driving speed and capability.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. An integrated circuit device, comprising:
   an electrically conductive pattern on a substrate;
   a first electrically insulating spacer on a sidewall of the electrically conductive pattern, the first electrically insulating spacer comprising a first lower spacer and a first upper spacer, which extends on the first lower spacer and has a side surface vertically aligned with a corresponding side surface of the first lower spacer, the first upper spacer having a greater dielectric constant relative to a dielectric constant of the first lower spacer;
   a pair of parallel channel regions protruding from a surface of the substrate, the pair of parallel channel regions vertically aligned to each other so that a first one of the pair of parallel channel regions is above a second one of the pair of parallel channel regions relative to the surface of the substrate; and
   an active region in the substrate, the active region forming a junction with the first one of the pair of parallel channel regions and comprising silicon germanium;
   wherein the electrically conductive pattern is a gate pattern that surrounds a top surface and side surfaces of the first one of the pair of parallel channel regions; and
   wherein an outer side surface of the first lower spacer is vertically aligned with the junction between the active region and the first one of the pair of parallel channel regions.

2. A semiconductor device comprising:
   a gate pattern formed on a substrate;
   a first spacer formed on a side surface of the gate pattern, wherein the first spacer includes a first upper spacer and a first lower spacer having vertically aligned side surfaces, and the first upper spacer has a higher dielectric constant than the first lower spacer;
   at least two channel regions protruding from the substrate and disposed parallel to one another, the at least two channel regions including a first channel region having a relatively high surface level and a second channel region having a relatively low surface level; and
   an active region formed on the second channel region, the active region including silicon germanium (SiGe);
   wherein the gate pattern surrounds a top surface and side surfaces of the first channel region; and
   wherein the active region has a diamond-shaped longitudinal section.

3. The device of claim 2, wherein a top surface of the active region is at a higher level than a top surface of the first channel region.

4. The device of claim 2, wherein an outer side surface of the first lower spacer is vertically aligned with a side surface of the active region.

5. The device of claim 2, further comprising a second spacer interposed between the side surface of the gate pattern and the first spacer,
   wherein the first upper spacer and the second spacer include silicon nitride, and the first lower spacer includes silicon oxide.

6. The device of claim 5, wherein top surfaces of the gate pattern, the first spacer, and the second spacer are co-planar.

7. A semiconductor device comprising:
   channel regions disposed on a substrate and configured to horizontally extend parallel to one another in a first direction;
   gate patterns configured to horizontally extend parallel to one another in a second direction orthogonal to the first direction and intersect the channel regions, each of the channel regions including a first channel region overlapping the corresponding one of the gate patterns and a second channel region non-overlapping the corresponding one of the gate patterns;
   active regions disposed on the second channel regions and including silicon germanium (SiGe);
   an inner spacer disposed on a side surface of each of the gate patterns; and
   an outer spacer disposed on a side surface of each of the inner spacers,
   wherein a side surface of the outer spacer is vertically aligned with the active regions.

8. The device of claim 7, further comprising a device isolation insulator formed on the substrate between the channel regions,
   wherein the device isolation insulator is at the same level as the second channel regions.

9. The device of claim 8, further comprising moldings disposed on the device isolation insulator adjacent to the second channel regions.

10. The device of claim 9, wherein the moldings are in contact with the second channel regions and disposed at a lower level than a top surface of the active regions.

11. The device of claim 1, wherein a top surface of the active region is higher relative to the surface of the substrate than the top surface of the first one of the pair of channel regions.

12. The device of claim 11, wherein the active region has a diamond-shaped cross-section.

13. The device of claim 1, further comprising a second electrically insulating spacer extending between the sidewall of the electrically conductive pattern and the first electrically insulating spacer, the second electrically insulating spacer comprising silicon nitride and the first lower spacer comprising silicon oxide.

14. The device of claim 13, wherein the first upper spacer comprises silicon nitride.

15. The device of claim 14, wherein top surfaces of the first and second electrically insulating spacers are coplanar with a top surface of the electrically conductive pattern.

\* \* \* \* \*